United States Patent [19]
Park

[11] Patent Number: 5,517,748
[45] Date of Patent: May 21, 1996

[54] APPARATUS FOR CONVEYING CIRCUIT BOARDS THROUGH A COMPONENT-MOUNTING STATION

[75] Inventor: Jun O. Park, Sueon, Rep. of Korea

[73] Assignee: Samsung Electronics Co., Ltd., Suwon, Rep. of Korea

[21] Appl. No.: 319,815

[22] Filed: Oct. 7, 1994

[51] Int. Cl.$^6$ .............................. H05K 3/30; H05K 13/02
[52] U.S. Cl. .................................. 29/741; 29/759; 29/794
[58] Field of Search ........................... 29/740, 741, 743, 29/759, 786, 793, 794; 198/345.1–345.3, 465.2, 465.3, 626.3; 432/242

[56] References Cited

U.S. PATENT DOCUMENTS

| | | | |
|---|---|---|---|
| 4,202,092 | 5/1980 | shibasaki et al. | 29/741 |
| 4,898,268 | 2/1990 | Kanioka et al. | 29/759 X |
| 4,951,240 | 8/1990 | Fukino | 29/759 X |
| 4,997,364 | 3/1991 | McGrath et al. | 432/242 X |
| 5,145,047 | 9/1992 | Terracol et al. | 29/794 X |

*Primary Examiner*—Peter Vo
*Attorney, Agent, or Firm*—Burns, Doane, Swecker & Mathis

[57] ABSTRACT

A circuit board is conveyed from a conveyor of a previous station to a conveying mechanism of a component-mounting station where components are applied to the circuit board. Then, the circuit board is delivered to a conveyor of a subsequent station. The conveying mechanism of the component-mounting station comprises a feed conveyor, an incoming conveyor disposed at one end of the feed conveyor, and an outgoing conveyor disposed at an opposite end of the feed conveyor. The incoming conveyor is laterally adjustable to become aligned with the conveyor of the previous station for receiving a circuit board therefrom, and then shift the circuit board laterally into alignment with the feed conveyor. The outgoing conveyor is likewise laterally adjustable to receive the circuit board from the feed conveyor and then shift the circuit board laterally into alignment with the conveyor of the subsequent station.

6 Claims, 4 Drawing Sheets

APPARATUS FOR CONVEYING CIRCUIT BOARDS THROUGH A COMPONENT-MOUNTING STATION

BACKGROUND OF THE INVENTION

This invention relates to an apparatus for mounting components on a circuit board, more particularly to an apparatus for mounting components on a circuit board.

A conventional apparatus for mounting components on a circuit board is shown in FIG. 4. A mounting assembly comprises a variable (adjustable) rail 2 and a stationary rail 1. The variable rail 2 is movable in a forward or rearward direction (upwardly or downwardly in FIG. 4) with respect to the stationary standard rail 1. A circuit board 4 from a previous process station is supplied into the mounting assembly via standard rail 3 for mounting components thereon. After mounting the components thereon the circuit board 4 is turned over to a subsequent process station which has a standard rail 5. In the structure, the rail 3 of the previous process station, the rail 1 of the present process and the rail 5 of the subsequent process 5 must be arranged in series and the respective rail flow directions of which are laid in the same direction. Those conditions are the precondition in order to achieve a successive work sequence in the above system. Hence, if the type of the product, e.g. size of circuit board, is changed, operation of the conveyor must be changed, correspondingly.

However, when the standard rail of the previous process station is offset from that of the present process station, it is difficult to establish a linearly operating system unless all equipment is made by a common manufactured. Thus, alternative sources of equipment are not possible.

When an obsolete machine has to be replaced by brand-new one of a different maker, otherwise, when an equipment in a middle of a line system must be replaced due to the price advantage, there is a problem in that one worker can not operate a plurality of equipment concurrently because a monitor installed in the replaced equipment is differently faced in respect to other equipment. That is, in the case that at least one machine among the series of machines is replaced, the equipment having a different standard rail in respect to either the previous process station or the subsequent process station can not be installed. Further, even when the respective standard rails are colinear equipment having a reversed feed direction (i.e., right-to-left in FIG. 4) of the circuit boards with respect to the previous feed direction and that of the subsequent process, can not be installed.

SUMMARY OF THE INVENTION

An object of the present invention is to provide an apparatus for mounting components on a circuit board which can work even if the standard rail of a given process station is different from either that of the previous process station or that of the subsequent process station.

Another object of the present invention is to provide an apparatus for mounting components on a circuit board in which the feed direction of the present process is in accord with that of the previous process station or that of the subsequent process station, if it is necessary.

According to the present invention, the apparatus for mounting components on a circuit board comprises an incoming distribution member which leads the print circuit board into a pair of rails among two pairs of parallel rails, a datum line of the one pair of rails is matched to a datum line of the printed circuit board, a mounting assembly which receives the printed circuit board through the rail of the mounting assembly for mounting the components thereon, a datum line of the rail is matched to that of the printed circuit board fed from the incoming distribution member, and an outgoing distribution member which provides a rail layout having a datum line corresponding to the datum line of the work completed printed circuit board.

The incoming distribution member has a structure in that one rail among one pair of rails is the same as one rail among another pair of rails, the one rail is common to both pairs of rails.

Further, the mounting assembly has the same structure as the incoming distribution member.

Further, the outgoing distribution member has the same structure as the incoming distribution member.

The respective feed directions of the printed circuit board in the incoming distribution member, the mounting assembly and the outgoing member have the same feed direction.

Further, the printed circuit board can be transferred in both a normal direction and a reverse direction.

In the apparatus for mounting components on a circuit board, one pair of rails in the incoming distribution member is moved to the printed circuit board fed from a previous process station. One rail of one pair of rails in the incoming distribution member is moved to match the datum line thereof to one of the board. The position-determined board is fed to one pair of the rails of the mounting assembly which has a corresponding datum line to the board. The mounted board is transferred into one pair of the rails of the outgoing distribution member which has a corresponding datum line to the mounted board, and later transferred into a rail of a successive process station.

If necessary, the feed direction of a board in each distribution member and the mounting assembly can be reversed and can be matched to the direction of either the previous process station or the successive process station.

In this apparatus, even if the standard rail of the mounting assembly is different from that of the previous process station or that of the subsequent process station, the board transfer can be performed without being interrupted. The feed direction of a board in this apparatus can be changed in accord with that of the previous process station or that of the subsequent process station.

DESCRIPTION OF THE PREFERRED EMBODIMENTS

Figure 1:
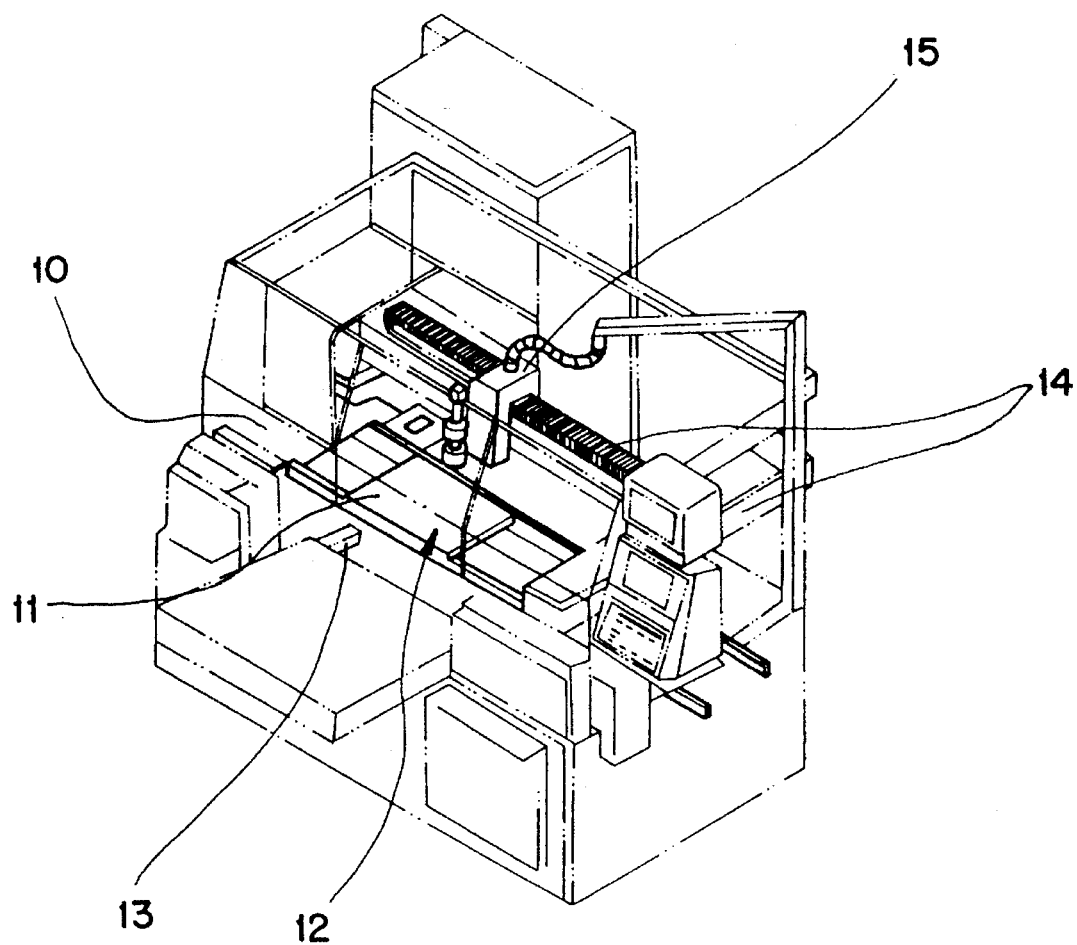
FIG. 1 is a perspective view of the apparatus for mounting components on a circuit board according to the present invention.

In FIG. 1, a printed circuit board 11 is provided at a print board running member 10 and the position of the print board 11 is determined by a position decision member 12. A first electronic component is supplied to a suction zone from a first cassette 13 according to a control program. A central tip of a suction nozzle (not shown) attached to a head 15 is being moved to the component suction zone by a X-Y robot 14 in order to suck the component. The sucked component is mounted on a predetermined spot of the circuit board.

Figure 2:
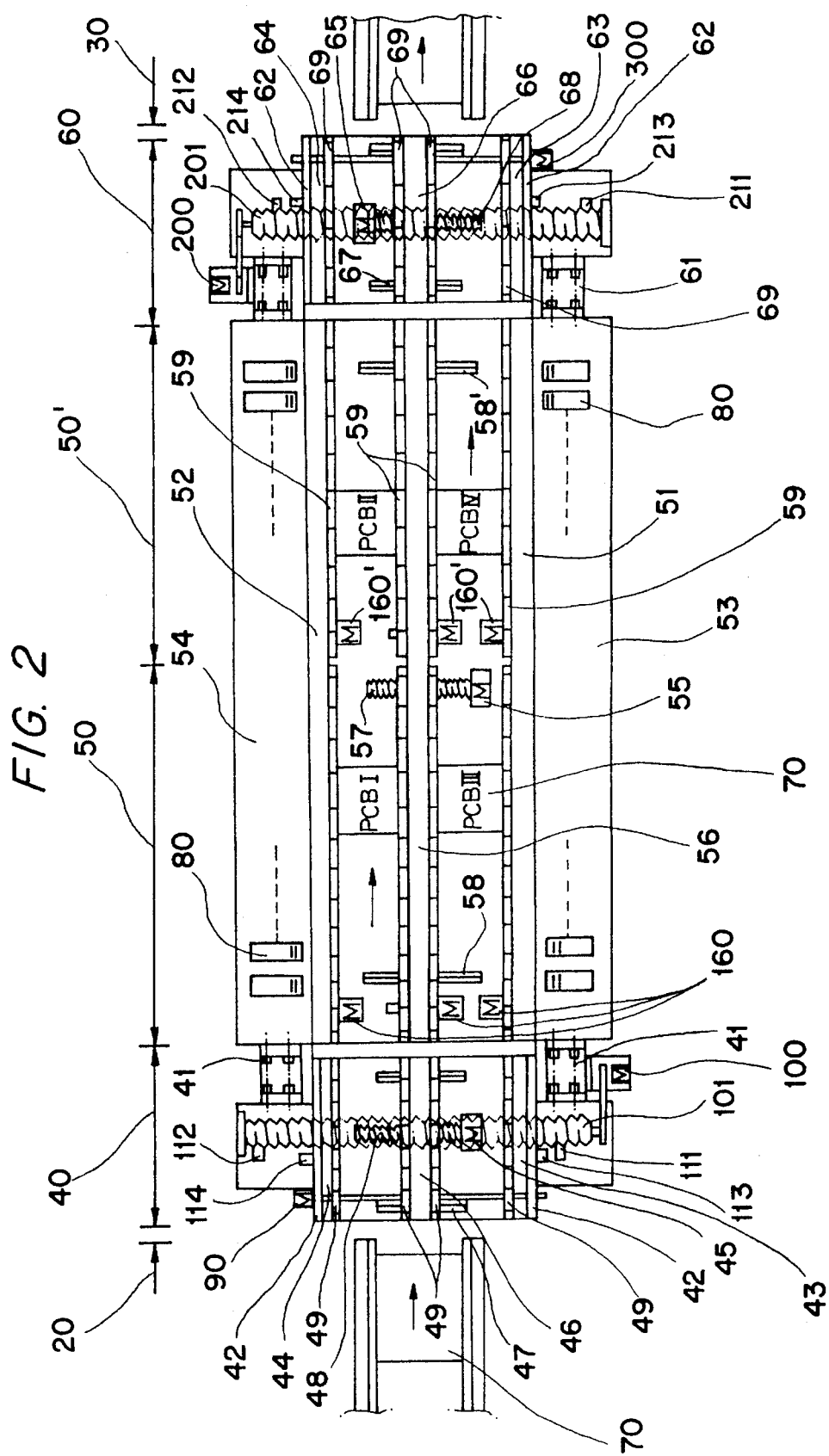
FIG. 2 is a plane view of the apparatus for mounting components on a circuit board illustrating the board feed direction, from the left side to the right side.

The above-described apparatus for mounting components on a circuit board, which is disposed between a previous process station 20 and a subsequent process station 30 as shown in FIG. 2, comprises an incoming member or section 40 for distributing the printed circuit board, mounting assemblies 50,50' which are disposed after the incoming member 40, successively, and an outgoing member or section 60 for discharging the processed printed circuit board.

The mounting assemblies 50,50' have a stationary standard rails 51,52 which is fixed to a front frame 53 (lower side in FIG. 2) and a rear frame 54 (upper side in FIG. 2), respectively, for establishing standard datum of the incoming circuit board. Between the front stationary rail 51 and the rear stationary rail 52, a variable (adjustable) rail 56 is provided which is operated (adjusted) by a control motor 55. The variable rail 56 moves upon a ball screw 57 of the control motor 55 and a space between the variable rail 56 on the one had and either of the front stationary rail 51 and the rear stationary rail 52 on the other hand can be adjusted in accordance with the adjustment of the variable rail 56. The variable rail 56 can be guided by linear guiders 58,58' which are installed at the mounting assemblies 50,50', respectively.

The rails 51, 52, 56 are comprised of belts 59 drive by belt motors 160, 160".

Thus, the rails 51, 56, 52 can be considered to constitute first, second and third feed rails, respectively, of a feed conveyor.

The incoming distribution member 40 and the outgoing distribution member 60 are provided at the left side of the mounting assembly 50 and at the right side of the mounting assembly 50', respectively. The distribution members 40,60 are attached to the mounting assemblies 50,50' by mounting brackets 41,61, respectively. Further, the incoming member 40 has a front standard stationary rail 43, a rear standard stationary rail 44 and a variable rail 46 which are mounted on the upper surface of a supporting plate 42. The variables rail 46 is disposed between the stationary rails 43,44 and can be moved by a screw 48 of a rail control motor 45 for adjusting the space between the variable rail 46 and the stationary rails 43,44. The movement of the variable rail 46 is are operated by a belt motor 90. The supporting plate 42 is moved forward or backward (i.e., up or down as viewed in FIG. 2) by a screw shaft 101 which is rotated by a board feed motor 100. Sensors 111,112 are provided under the supporting boards 42F,42R, respectively. Sensor dogs 113, 114 are attached under the supporting plate 42 at both the upper side thereof and the lower side thereof. The location of the sensors 111,112 and the sensor dog 113,114 is decided under the below-described condition. The movement of the supporting plate 42 is stopped when the sensor dogs 113 or the rail 43 (reference rail) is matched to the sensor 111 or the front rail 51, respectively, if the front rail 51 is selected as a reference rail.

Thus, the rails 43, 46, 44 can be considered to constitute first, second, and third incoming distribution rails, respectively, of an incoming distribution section.

In the same manner, the outgoing member 60 has a front standard stationary rail 63, a rear standard stationary rail 64 and a variable rail 66 which are mounted on the upper surface of a supporting plate 62. The variable rail 66 is disposed between the stationary rails 63,64 and can be moved by a screw 68 of a rail control motor 65 for adjusting the space between the variable rail 66 and the stationary rails 63,64. The movement of the variable rail 66 is guided by a linear guider 67,67'. Belts 69 of the rails 63,64,66 are operated by a belt motor 300. The supporting plate 62 is moved forward or backward by a screw shaft 201 which is rotated by a board feed motor 300. Sensors 211,212 are provided under the supporting boards 62F,62R, respectively. Sensor dogs 213,214 are attached under the supporting plate 62 at both the upper side thereof and the lower side thereof. The location of the sensors 211,212 and the sensor dogs 213,214 is decided under the below-described condition. The movement of the supporting plate 62 is stopped when the sensor dogs 213 or the rail 63 (reference rail) is matched to the sensor 211 or the front rail 51, respectively, if the front rail 51 is selected as a reference rail.

Thus, the rails 63, 66, 64 can be considered to constitute first, second , and third outgoing distribution rails, respectively, of an outgoing distribution section.

The apparatus for mounting components on a circuit board built as described above is operated as follows. In the case that the front stationary rail 51 is a reference rail, the variable rail 56 is moved to adjust the space with respect to the front stationary rail 51 as the motor 55 of the variable rail 56 operates. The variable rail 56 runs along the screw 57 of the motor 55 and is guided by the linear guider 58,58' to establish the position setting.

In the incoming member 40, the variable rail 46 is moved along the linear guiders 47,47' by the screw 48 as the motor 45 operates. Further, the motor 90 for driving the belt 49 operates to convey the printed circuit board 70 on both the front stationary rail 43 and the variable rail 46. The board feeding motor 100 of the incoming member 40 operates and the screw shaft 101 is turned by a pulley and a belt and thus the supporting plate 42 is moved upward or downward shown in FIG. 2 depending on the reference line of the mounting assembly 50,50'. When the reference line of the board 70 in the incoming member 40 is matched with the reference line of the rail 51 in the mounting assembly 50,50', the board 70 is transferred into the mounting assembly 50, 50'.

After components 80 are mounted on the board 70 in the mounting assembly 50,50', the board 70 is moved to the outgoing member 60 by the run of the belt 59 which is operated by the motor 60. The operation of the outgoing member 60 is the same as that of the incoming member 40. Thus, no detailed explanation of the outgoing member will be provided. Finally,the board 70 is discharged to the subsequent process station.

Figure 3:
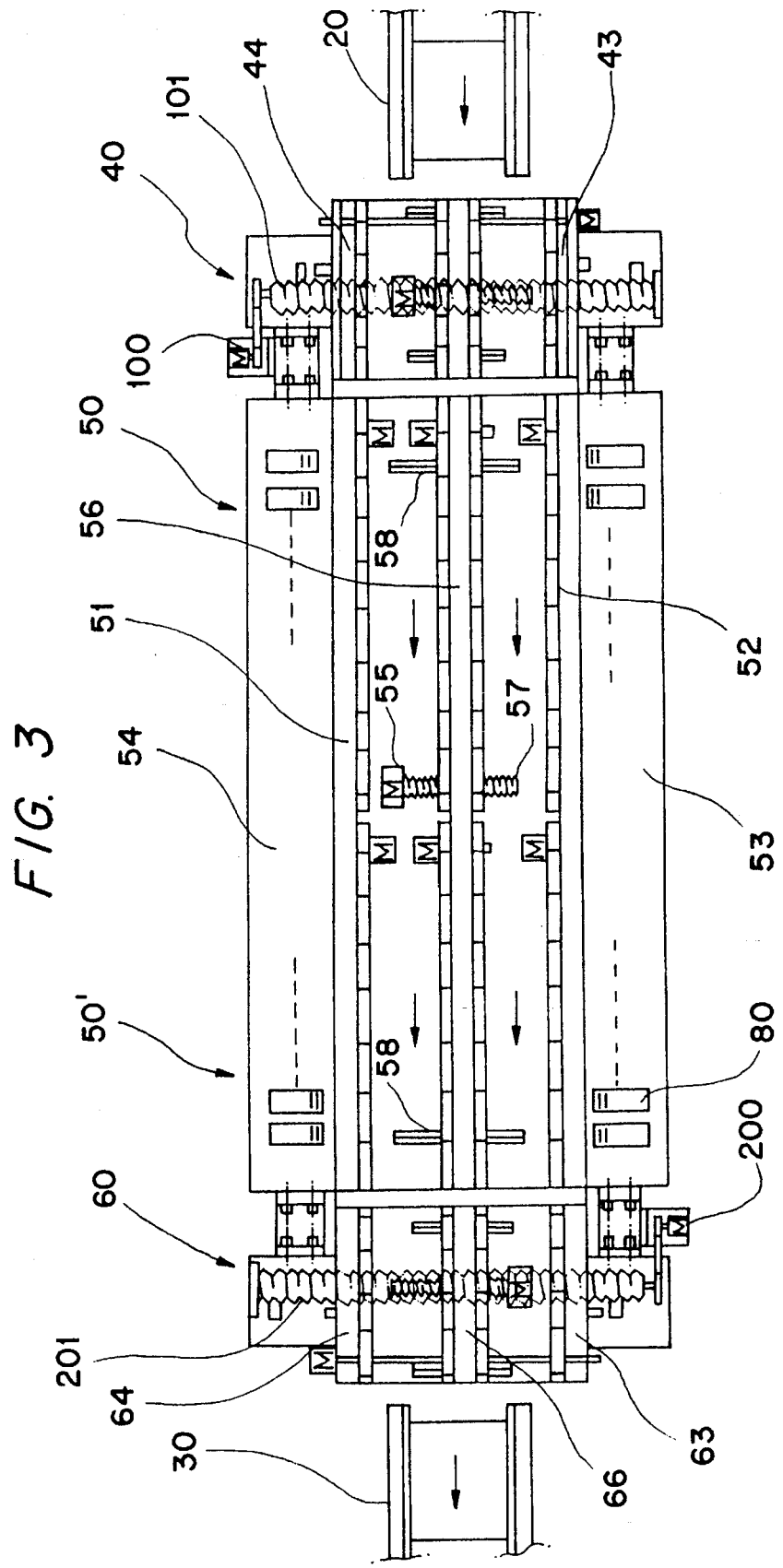
FIG. 3 is a plan view of the apparatus for mounting components on a circuit board illustrating the board feed direction, from the right side to the left side.
Figure 4:
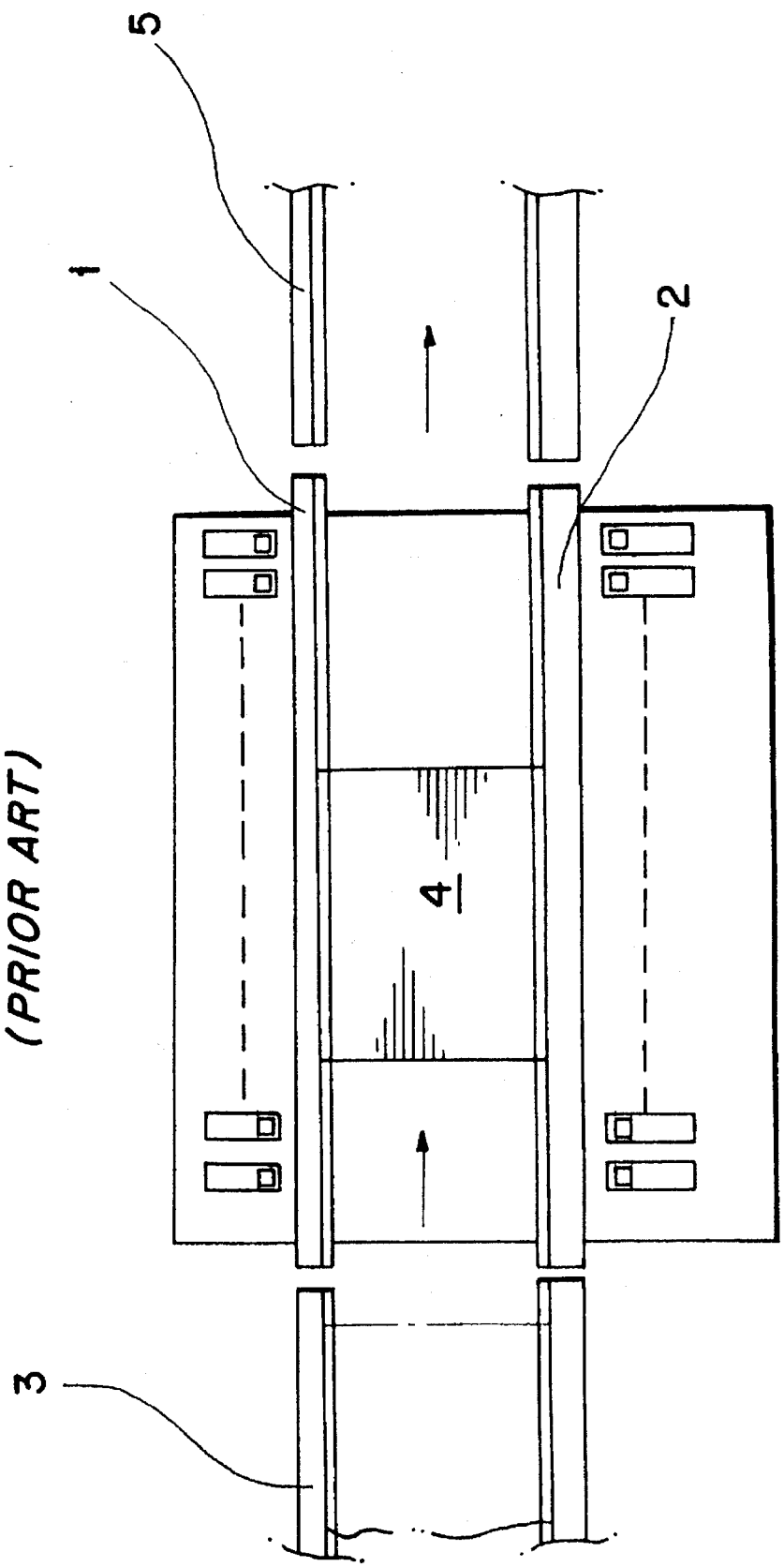
FIG. 4 is a plan view of the apparatus for mounting components on a circuit board according to the prior art.

FIG. 3 illustrates that the printed circuit board is moving from the right side to the left side, which moves in a reverse direction with respect to FIG. 2. Thus, the invention operate regardless of the supply direction.

Further, since the front stationary rail and the rear stationary rail extend for a relatively long distance, the head attached on the X-Y robot would have to move in a long travel range. That would create a problem that it would require an increased cycle time. To solve the problem, this invention employs dual board position area I,II and III,IV in one pair of rails that is when the rear reference line is chosen, the board position area I,II are used, whereas when the front reference line is chosen, the board position area III,IV are used. Assuming that the rear reference line has been chosen, the components corresponding to only the board position area I (i.e., the PCBI in FIG. 2) are mounted on the board.

The components are stored on a portion of the rear frame 54 disposed near the board position area I. Then, the board is fed into the board position area II (i.e., the PCBII in FIG. 2) the components corresponding to only the board position area II are mounted on the board. Those components are stored on a portion of the rear frame 54 disposed near the board position area II. At the same time, while the board in the board position area II is receiving components the next board is positioned in the board position area I.

What is claimed is:

1. In an apparatus for mounting components onto a printed circuit board, including a conveying mechanism for conveying printed circuit boards, said conveying mechanism comprising:

a component-mounting section including parallel first, second, and third feed rails spaced laterally apart for feeding a circuit board longitudinally; and an incoming distribution section arranged adjacent one end of said component-mounting section and including parallel first and second incoming distribution rails spaced laterally apart for feeding a circuit board to said first and second feed rails;

said first and second incoming distribution rails being laterally adjustable relative to said first, second and third feed rails, and a lateral spacing between said first and second incoming distribution rails being adjustablely said first and third feed rails being laterally stationary, said second feed rail being disposed between said first and third feel rails and being laterally adjustable relative to both of said first and third feed rails.

2. In the apparatus according to claim 1, said conveying mechanism further including an adjusting mechanism for adjusting a lateral spacing of said second feed rail with respect to said first and third feed rails.

3. The apparatus according to claim 1, wherein said incoming distribution section includes a third incoming distribution rail arranged parallel to said first and second incoming distribution rails, said first and third incoming distribution rails being laterally stationary relative to one another, said second incoming distribution rail being disposed between said first and third incoming distribution rails and laterally adjustable relative to both of said first and third incoming distribution rails; said first, second and third incoming distribution rails being laterally adjustable relative to said first, second and third feed rails.

4. In the apparatus according to claim 1, wherein said conveying mechanism further comprises an outgoing distribution station located at an end of said component-mounting station disposed opposite said incoming distribution section, said outgoing distribution section including parallel first and second outgoing distribution rails spaced laterally apart for removing a circuit board from said first and second feed rails; said first and second outgoing distribution rails being laterally adjustable relative to said first and second feed rails, and a lateral spacing between said first and second distribution rails being adjustable.

5. In the apparatus according to claim 1, wherein said first and second incoming distribution rails are mounted on table movable laterally relative to said first, second and second feed rails.

6. In the apparatus according to claim 1, wherein each of said first, second and third feed rails and said first and second distribution rails includes an endless conveyor belt.

* * * * *